United States Patent
Oi

(10) Patent No.: US 11,660,788 B2
(45) Date of Patent: May 30, 2023

(54) METHOD FOR PRODUCING SEALED STRUCTURE

(71) Applicant: NAGASE CHEMTEX CORPORATION, Osaka (JP)

(72) Inventor: Yosuke Oi, Tatsuno (JP)

(73) Assignee: NAGASE CHEMTEX CORPORATION, Osaka (JP)

(*) Notice: Subject to any disclaimer, the term of this patent is extended or adjusted under 35 U.S.C. 154(b) by 162 days.

(21) Appl. No.: 16/999,743

(22) Filed: Aug. 21, 2020

(65) Prior Publication Data

US 2021/0053258 A1 Feb. 25, 2021

(30) Foreign Application Priority Data

Aug. 23, 2019 (JP) .............................. JP2019-153104

(51) Int. Cl.
*B29C 43/14* (2006.01)
*C08K 7/18* (2006.01)
(Continued)

(52) U.S. Cl.
CPC .......... *B29C 43/146* (2013.01); *B29C 43/003* (2013.01); *C08K 7/18* (2013.01); *B29C 2043/147* (2013.01); *B29C 2795/002* (2013.01); *B29K 2063/00* (2013.01); *B29K 2105/0005* (2013.01); *B29K 2105/0094* (2013.01);
(Continued)

(58) Field of Classification Search
CPC ..... B29C 43/146; B29C 43/003; B29C 43/18; B29C 43/183; B29C 43/20; B29C 43/203; B29C 2043/146–147; B29C 2043/58; B29C 2043/181; B29C 2043/5825;
(Continued)

(56) References Cited

U.S. PATENT DOCUMENTS 5,232,651 A * 8/1993 Okuno .................. H05K 3/0091
264/251
5,424,250 A * 6/1995 Sawada ................... H01L 21/56
264/293
(Continued)

FOREIGN PATENT DOCUMENTS

JP 2002-076034 A 3/2002
JP 2004056141 A * 2/2004
(Continued)

*Primary Examiner* — Jeffrey M Wollschlager
*Assistant Examiner* — Xue H Liu
(74) *Attorney, Agent, or Firm* — Sughrue Mion, PLLC

(57) ABSTRACT

A method of producing a sealed structure, the method including: preparing a substrate and a curable resin composition in a liquid form; and sealing the substrate with the curable resin composition, to form a sealed body including the substrate and a cured product of the curable resin composition. The sealing step includes: printing the curable resin composition onto the substrate, to cover the substrate with a first coating film of the curable resin composition; and compression-molding the first coating film and the substrate together using a mold, with a pressing surface of the mold abut against the first coating film, to convert the first coating film into a second coating film. A ratio of a projected area S1 of the first coating film onto the substrate to a projected area S2 of the second coating film onto the substrate: S1/S2 is 0.9 or more.

5 Claims, 2 Drawing Sheets

(51) Int. Cl.
*B29C 43/00* (2006.01)
*B29K 63/00* (2006.01)
*B29L 31/34* (2006.01)
*B29K 105/00* (2006.01)
*B29K 509/08* (2006.01)
*B29K 105/16* (2006.01)

(52) U.S. Cl.
CPC ...... *B29K 2105/16* (2013.01); *B29K 2509/08* (2013.01); *B29L 2031/3406* (2013.01)

(58) Field of Classification Search
CPC ....... B29C 2795/002; B29L 2031/3406; B29L 2031/3425; H01L 21/56
USPC ............... 264/134, 272.11, 279, 319, 325
See application file for complete search history.

(56) References Cited

U.S. PATENT DOCUMENTS

| | | | | |
|---|---|---|---|---|
| 2009/0020779 A1* | 1/2009 | Yamada | ............... | B29C 43/146 257/E33.059 |
| 2012/0040499 A1* | 2/2012 | Nomura | ............... | C08G 59/686 523/400 |

FOREIGN PATENT DOCUMENTS

| | | | |
|---|---|---|---|
| JP | 2005-019503 A | 1/2005 |
| JP | 2006-013274 A | 1/2006 |
| JP | 2015-005611 A | 1/2015 |
| JP | 2018-118189 A | 8/2018 |
| JP | 2018-170316 A | 11/2018 |

\* cited by examiner

METHOD FOR PRODUCING SEALED STRUCTURE

CROSS REFERENCE TO RELATED APPLICATION

The present application is based on and claims priority under 35 U.S.C. § 119 with respect to the Japanese Patent Application No. 2019-153104 filed on Aug. 23, 2019, of which entire content is incorporated herein by reference into the present application.

TECHNICAL FIELD

The present invention relates to a method for producing a sealed structure.

BACKGROUND

With growing demand for smaller and thinner semiconductor products in recent years, attention has been drawn to packaging technologies known as panel level package (PLP) technology and wafer level package (WLP) technology. In these packaging technologies, a plurality of semiconductor elements placed or formed on a panel or wafer are sealed collectively with a resin sealing material.

The form of the resin sealing material is selected according to an employed sealing method, from various forms, such as tablet, granular, sheet, and liquid forms. Among them, a resin sealing material (e.g., curable resin composition) in a liquid form has been widely used, in view of its easiness of achieving thinning and miniaturization, and its versatility of application to various mounting styles. Typically, a resin sealing material in a liquid form is applied onto a substrate by a technique, such as coating or printing, as disclosed in Patent Literatures 1 (JP 2018-118189), 2 (JP 2018-170316) and 3 (JP 2006-13274). Sealing is sometimes performed by compression molding using a resin sealing material in a liquid form, as disclosed in Patent Literature 4 (JP 2015-5611).

A sealing material in a tablet form is usually transfer-molded into a cavity that is shaped as desired. In the case of forming a thin molded portion, however, the fluid pressure sometimes causes the internal elements to be damaged, or the metal wire to be deformed or broken. A sealing material in a granular form is typically compression-molded. In the case of forming a thin molded portion, however, it is necessary to reduce the granule size.

SUMMARY

When a curable resin composition in a liquid form is compression-molded onto a substrate, as it spreads on the substrate, the distribution of the component contained in the curable resin composition sometimes becomes uneven, causing flow marks to appear. When a curable resin composition in a liquid form is applied onto a substrate by printing, the variations in thickness of a coating film of the curable resin composition increases.

Among these, flow marks become more likely to occur when using a substrate having a larger area and forming a thinner coating film of the curable resin composition over the substrate. This is because the larger the area of the substrate is, the longer the flow distance of the curable resin composition becomes. Moreover, the more thinly the coating film of the curable resin composition is to be formed, the more the fluidity of the curable resin composition is likely to be restricted. One possible way to solve the flow mark issue while achieving a thinner coating film would be to form a coating film with a certain thickness first and then subjecting the coating film to an abrading process. The abrading process is, however, cost and labor consuming.

To address the increased variations in thickness of the coating film of the curable resin composition, there has been examined a technique of pressing a flat board against a layer of a resin sealing material formed by application or printing, thereby to smooth the surface, as disclosed in Patent Literatures 5 (JP 2002-76034) and 6 (JP 2005-19503). Even when a flat board is pressed against the coating film formed by application or printing, however, as the curable resin composition is forced to spread, the distribution of its component may be varied, causing flow marks to appear. Especially when using a substrate having a large area and forming a thin coating film of the curable resin composition over the substrate, the occurrence of flow marks becomes more noticeable.

One aspect of the present invention relates to a method of producing a sealed structure, the method including: a first step of preparing a substrate and a curable resin composition in a liquid form; and a second step of sealing the substrate with the curable resin composition, to form a sealed body including the substrate and a cured product of the curable resin composition, the second step including: a printing step of printing the curable resin composition onto the substrate, to cover the substrate with a first coating film of the curable resin composition; and a molding step of compression-molding the first coating film and the substrate together using a mold, with a pressing surface of the mold abut against the first coating film, to convert the first coating film into a second coating film, wherein a ratio of a projected area S1 of the first coating film onto the substrate to a projected area S2 of the second coating film onto the substrate: S1/S2 is 0.9 or more.

According to the above aspect of the present invention, in sealing a substrate using a curable resin composition in a liquid form, without an abrading process, it is possible to reduce the variations in thickness of the coating film of the curable resin composition and suppress the uneven distribution of the component of the curable resin composition.

DETAILED DESCRIPTION

Figure 1:
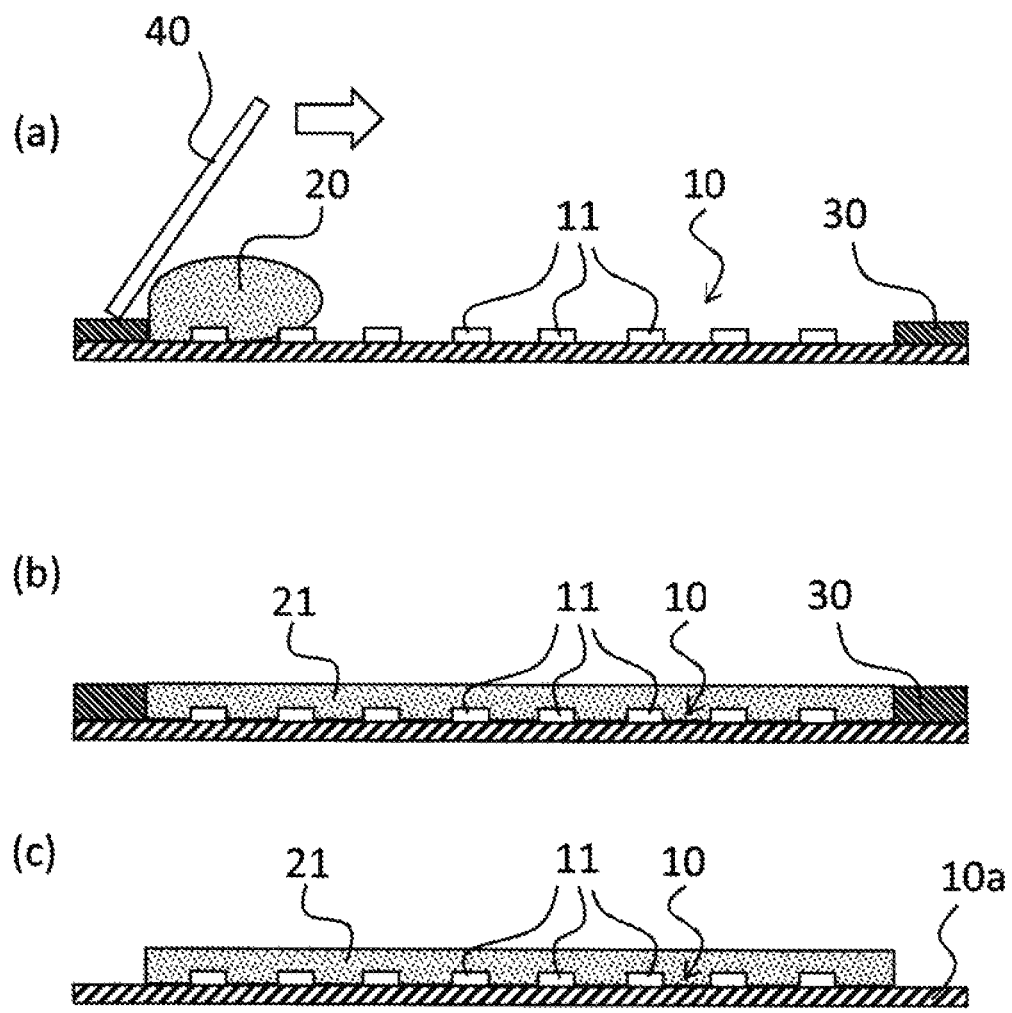
FIG. 1 is a flow diagram of a printing step of a method of producing a mounting structure (sealed structure) according to an embodiment of the present invention.

In sealing a substrate having a semiconductor element or an electronic component, when a curable resin composition in a liquid form is applied by a printing technique, first, the curable resin composition is spread over the substrate with a squeegee or the like. Next, the formed coating film of the curable resin composition is cured, to complete sealing. However, in the printing technique, the variations in thickness of the coating film increase due to the resistance and the flow disturbance that occur while the curable resin composition is being spread with a squeegee or the like.

On the other hand, when a flat board is pressed against the coating film of the curable resin composition formed by printing, the variations in thickness of the coating film can be suppressed to some extent. However, as the curable resin composition is forced to spread on the surface of the substrate, the distribution of the solid component in the coating film may be varied. The uneven distribution of the solid component can be observed as flow marks. Flow marks are resulted from, for example, uneven distribution of the solid component, such as a filler, in a peripheral portion of the coating film. The flow marks spoil the appearance of the coating film or the sealed body, and moreover, can be a cause of warping of the sealed body and other defects.

In view of the above, a method of producing a sealed structure according to an embodiment of the present invention includes: a first step of preparing a substrate and a curable resin composition in a liquid form; and a second step of sealing the substrate with the curable resin composition, to form a sealed body including the substrate and a cured product of the curable resin composition. The second step includes: a printing step of covering the substrate with a first coating film of the curable resin composition; and a molding step of compression-molding the first coating film and the substrate together, to convert the first coating film into a second coating film. A ratio of a projected area S1 of the first coating film onto the substrate to a projected area S2 of the second coating film onto the substrate: S1/S2 is restricted to 0.9 or more. Herein, the sealed structure encompasses the sealed body including a further processed product of the sealed body.

Herein, the projected area S1 or S2 of the first or second coating film onto the substrate is an area as measured when each coating film is projected onto a surface of the substrate. In the case where the coating film is formed in a divided manner into one or more portions, the total of the projected areas of the one or more portions of the coating film is determined as S1 or S2.

As described above, by combining the printing step and the molding step, and setting the S1/S2 ratio to 0.9 or more, it is possible to suppress the variations in thickness of the second coating film, as well as to suppress the uneven distribution of the solid component in the curable resin composition that may occur as the curable resin composition spreads on the surface of the substrate during compression molding. Presumably, this is mainly because the flow distance of the curable resin composition constituting the first coating film becomes shorter. This, as a result, can reduce the occurrence of flow marks in the second coating film due to uneven distribution of the solid component.

For example, even when the second coating film has a maximum length L of more than 212 mm, the occurrence of flow marks can be suppressed. Such an effect can be obtained when the maximum length L is as large as 250 mm or more or 280 mm or more. The maximum length L is not limited, but may be, for example, less than 294 mm.

A ratio of the maximum length L of the second coating film to a maximum thickness T of the second coating film (=L/T) is preferably more than 653, more preferably 720 or more. The uneven distribution of the solid component and the occurrence of flow marks associated therewith tend to be noticeable especially when the curable resin composition is thinly applied or applied over a wide area. When the L/T ratio is in the range as above, in the conventional sealing by compression molding, the uneven distribution of the component contained in the curable resin composition and the occurrence of flow marks associated therewith become noticeable. In contrast, according to the production method of the present embodiment, even under the conditions in which uneven distribution of the component tends to occur, by setting the S1/S2 ratio within the above range, the uneven distribution of the component can be suppressed, and the occurrence of flow marks can be effectively suppressed. The S1/S2 ratio may be further higher, and may be, for example, 0.95 or more. However, when the S1/S2 ratio is too close to 1, the resin may leak during molding. Therefore, the S1/S2 ratio may be set to 0.99 or less, and may be set to 0.98 or less.

The maximum length L of the second coating film is a maximum length (mm) in a projected shape of the second coating film onto the substrate. In other words, the maximum length L is a length of the longest portion of the second coating film when viewed from above. For example, when the shape of the second coating film as viewed from above is rectangular, the length of the diagonal is the maximum length L. When the shape of the second coating film as viewed from above is similar to an ellipse or circle, the maximum diameter can be determined as the maximum length L.

In the case where the second coating film is formed in a divided manner into one or more portions on the surface of the substrate, the one or more portions of the second coating film are projected onto the surface, to draw an imaginary frame that surrounds all of the portions projected onto the surface and has a smallest area. A maximum length (mm) of the imaginary frame can be determined as L.

The maximum thickness T of the second coating film is a thickness (i.e., maximum value) of a cured product (or a semi-cured (B stage) product) of the curable resin composition formed on a surface of the substrate, as measured from the substrate surface, in the sealed body. The thickness from the substrate surface of the second coating film is measured at a plurality of points on the substrate (e.g., 10 points), and an average of the measured values can be determined as the maximum thickness T.

The maximum thickness T of the second coating film may be, for example, 0.4 mm or less (i.e., 400 μm or less). In the case of forming such a thin coating film, the fluidity of a curable resin composition in a liquid form usually tends to be restricted, and even when printing and compression molding are used in combination, flow marks due to uneven distribution of the solid component tend to appear in the second coating film. By restricting the S1/S2 ratio to 0.9 or more, the occurrence of flow marks can be significantly suppressed even when forming a very thin second coating film.

In the printing step, air may be entrapped, causing voids to be formed within the first coating film. Therefore, the printing step is preferably performed under reduced pressure (e.g., 300 hPa or less).

The compression molding may be performed under reduced pressure (e.g., 10 hPa or less). Even when voids are formed in the first coating film in the printing step, the voids can be reduced during compression molding, and almost all the voids can be eliminated.

A detailed description will be given below of a method of producing a sealed structure according to an embodiment of the present invention.

(First Step)

In a first step, a substrate having an electronic component or the like is prepared, and a curable resin composition in a liquid form is prepared.

The substrate has, for example, a semiconductor element, an electronic component, and the like. The substrate encompasses a wafer, a panel, a glass substrate, a resin substrate, and a printed wiring substrate. Examples of the wafer include a silicon wafer, a sapphire wafer, and a compound semiconductor wafer. Examples of the resin substrate includes a bismaleimide triazine substrate, a polyimide substrate, and a fluororesin substrate.

The substrate may be an assembly of electronic components. The assembly of electronic components may be, for example, an assembly of semiconductor chips before singulated into individual chips. The sealed structure produced by the method according to the present invention encompasses, for example, a package called wafer-level package (WLP) or panel-level package (PLP).

Especially when applied for packages, such as PLP and WLP, it is required to apply a curable resin composition in a liquid form thinly and uniformly onto a surface of a wafer or panel having a large area. According to the production method of the present embodiment, even when used for such applications, the variations in thickness of the second coating film can be reduced, and the occurrence of flow marks can be effectively suppressed over a wide area.

(Curable Resin Composition)

The curable resin composition used here is liquid. A liquid curable resin composition has fluidity at room temperature (20 to 35° C.). The curable resin composition usually includes one or more solid components. When a solid component is contained in the curable resin composition, uneven distribution of the solid component tends to occur, and flow marks tend to appear.

The solid component may be an inorganic or organic material. The solid component may be dispersed in the curable resin composition in any state, such as a particulate, flaky, or fibrous state. A typical curable resin composition in a liquid form used for a sealed structure contains an inorganic powder as a filler.

The curable resin composition includes, for example, a curable resin, a filler, a curing agent and/or a curing accelerator. Although the curable resin composition may be thermosetting or photocurable, a description will be given below mainly of a thermosetting resin composition.

The curable resin composition includes a curable resin as an essential component (base resin). The curable resin is not limited, but may include, as the base resin, an epoxy resin, phenolic resin, silicone resin, melamine resin, urea resin, alkyd resin, polyurethane, or the like. Among these, an epoxy resin is particularly excellent in terms of heat resistance and cost. These may be used singly, or in combination of two or more kinds.

Examples of the epoxy resin include, but not limited to, bisphenol A-type epoxy resin, bisphenol F-type epoxy resin, bisphenol AD-type epoxy resin, naphthalene-type epoxy resin, biphenyl-type epoxy resin, glycidyl amine-type epoxy resin, alicyclic epoxy resin, dicyclopentadiene-type epoxy resin, polyether-type epoxy resin, and silicone-modified epoxy resin. These may be used singly or in combination of two or more kinds. Preferred among them are naphthalene-type epoxy resin, bisphenol A-type epoxy resin, bisphenol F-type epoxy resin, and bisphenol AD-type epoxy resin. More preferred are bisphenol A-type epoxy resin, bisphenol F-type epoxy, and naphthalene-type epoxy resin, and further more preferred is naphthalene-type epoxy resin in terms of humidity resistance.

The phenol resin is, although not particularly limited to, preferably a phenol novolac resin. A phenol novolac resin is a condensed polymer of phenol or naphthol (e.g., phenol, cresol, alkylphenol, bisphenol, terpene phenol, naphthol) and formaldehyde. Specific examples thereof include phenol novolac resin, cresol novolac resin, alkyl phenol novolac resin, biphenyl phenol novolac resin, terpene phenol novolac resin, α-naphthol novolac resin, and β-naphthol novolac resin. Among these, in view of the water resistance, naphthol novolac resin is preferred. These may be used singly or in combination of two or more kinds.

The curing agent for the epoxy resin may be, other than the aforementioned phenol resin, for example, an acid anhydride, an amine compound, and the like. Examples of the acid anhydride include, but not limited to, hexahydrophthalic anhydride, alkylhexahydrophthalic anhydride, alkyltetrahydrophthalic anhydride, trialkyltetrahydrophthalic anhydride, methylnadic anhydride, and methylnorbornane-2,3-dicarboxylic anhydride. These may be used singly, or in combination of two or more kinds.

Examples of the amine compound include, but not limited to, tetramethyl diaminodiphenylmethane, tetraethyl diaminodiphenylmethane, diethyl dimethyl diaminodiphenylmethane, dimethyl diamino toluene, diamino dibutyl toluene, diamino dipropyl toluene, diamino diphenyl sulfone, diamino ditolyl sulfone, diethyl diamino toluene, bis(4-amino-3-ethylphenyl)methane, and polytetramethyleneoxide-di-p-aminobenzoate.

Examples of the curing accelerator include, but not limited to, an imidazole-based curing accelerator, a phosphorous-based curing accelerator, a phosphonium salt-based curing accelerator, bicyclic amidines and derivatives thereof, an organic metal complex, and a urea-modified polyamine. The curing accelerator is preferably a latent curing accelerator. Examples of the latent curing accelerator include an imidazole-based curing accelerator and a phosphorus-based curing accelerator. A particularly preferred latent curing accelerator is an encapsulated imidazole-modified product (microcapsule-type curing accelerator).

The filler may be, for example, a silica (e.g., fused silica, crystalline silica), quartz glass powder, calcium carbonate, or aluminum hydroxide. Preferred among them is a silica, and more preferred is a fused silica.

The filler may be contained in any amount in the curable resin composition. For example, when the filler content is 50 mass % or more (or 60 mass % or more), particularly when it is 70 mass % or more (or 80 mass % or more), flow marks tends to considerably occur in the conventional method. In the production method according to the present embodiment, even when the content of the solid component, such as the filler, is as high as above, the occurrence of flow marks can be effectively suppressed. The content of the solid component has no upper limit, but may be 95 mass % or less, may be 93 mass % or less, and may be 90 mass % or less.

The filler may have an average particle diameter of, for example, 1 μm or more, and may be 5 μm or more. When the average particle diameter of the filler is comparatively large, for example, 10 μm or more or 15 μm or more, it is usually difficult to suppress the occurrence of flow marks over a wide area. According to the production method of the present embodiment, even when the filler has a large average particle diameter, the occurrence of flow marks can be suppressed over a large area of the coating film. The average particle diameter of the filler, for example, may be 75 μm or less, may be 50 μm or less, may be 30 μm, and may be 25 μm or less.

The average particle diameter is a particle diameter (D50) at 50% cumulative volume in a volumetric particle size distribution. The average particle diameter (D50) can be measured by a laser diffraction scattering method, using a laser diffraction-type particle size distribution analyzer.

The curable resin composition may further contain an additive. Examples of the additive include, but not limited to, a silane coupling agent, a carbon black, a defoaming agent, a leveling agent, a pigment, a stress-reducing agent, a pre-gelling agent, and an ion catcher.

The curable resin composition has a viscosity at 25° C. of, for example, 10 Pa·s or more, and may be 1000 Pa·s or more. When the viscosity is comparatively high, the solid component tend to aggregate, and flow marks tend to considerably occur in the conventional method. In the production method according to the present embodiment, even when the viscosity is as high as above, the uneven distribution of the solid component can be suppressed. The viscosity of the curable resin composition is, for example, 1000 Pa·s or less, may be 800 Pa·s or less, and may be 300 Pa·s or less. The viscosity may be 100 Pa·s or more, and may be 250 Pa·s or more. These lower limits and upper limits can be combined in any combination.

The above viscosity can be measured using, for example, an E type (cone-plate type) viscometer at a rotor rotation speed of 10 rpm.

Note that the composition of the curable resin composition is not limited to the above. The curable resin composition may be of one-liquid curing type or two-liquid curing type.

(Second Step)

Figure 2:
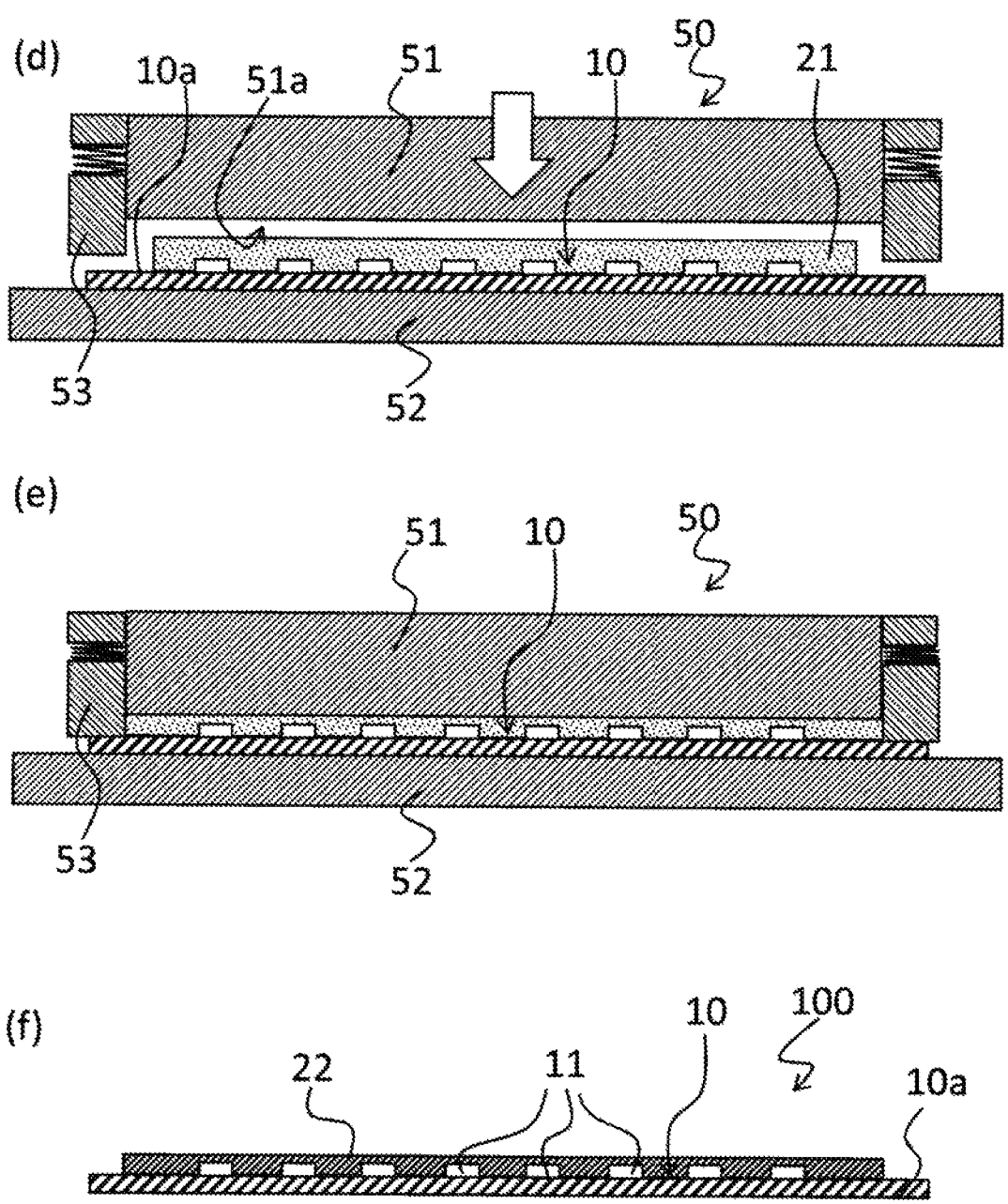
FIG. 2 is a flow diagram of a molding step of a method of producing a mounting structure (sealed structure) according to an embodiment of the present invention.

A description will be given below of a second step, with reference to FIGS. 1 and 2. The second step includes a printing step of covering the substrate with a first coating film of the curable resin composition, and a molding step of compression-molding the first coating film and the substrate together, to convert the first coating film into a second coating film.

(Printing Step)

In the printing step, a curable resin composition 20 is printed on a substrate 10 having a plurality of semiconductor elements 11 thereon. For example, as illustrated in FIG. 1(a), a first coating film 21 can be formed by means of stencil printing (e.g., screen printing) using a stencil 30 and a squeegee 40. As illustrated in FIG. 1(b), the first coating film 21 is desirably formed so as to cover almost all the surface of the substrate 10 together with the semiconductor elements 11, and may be formed so as to cover the entire surface of the substrate 10. Also, as illustrated in FIG. 1(c), a non-coating region 10a having no first coating film 21 may be provided at the peripheral portion of the substrate. The substrate 10 with the first coating film 21 formed thereon is then released from the stencil 30 as shown in FIG. 1(c), and conveyed to the next molding step.

The printing step can spread the curable resin composition 20 over a substrate having a large area, while suppressing the aggregation of the solid component. In the printing step, however, since the curable resin composition 20 is spread using the squeegee 40, the thickness of the first coating film 21 varies greatly.

The squeegee 40 is moved at a speed of, for example, 10 mm/s or more, and may 20 mm/s or more, or 30 mm/s or more. When the squeegee speed is in the range above, the aggregation of the solid component can be more effectively suppressed, and the occurrence of flow marks can be easily suppressed over a wider area.

The first coating film formed by printing has a maximum thickness t of, for example, 0.5 mm or less, may be 0.4 mm or less, 0.3 mm or less, 0.2 mm or less, or 0.15 mm or less. The lower limit of the maximum thickness t of the first coating film is, for example, 0.01 mm or more. The maximum thickness t of the first coating film is a thickness (i.e., maximum value) of the printed coating film as measured from the substrate surface. The thickness from the substrate surface of the first coating film is measured at a plurality of points on the substrate (e.g., 10 points), and an average of the measured values can be determined as the maximum thickness t.

The printing step may be performed under atmospheric pressure or under reduced pressure (e.g., under a pressure of less than 300 hPa, or a further lower pressure of less than 100 hPa). Performing the printing step under reduced pressure can suppress the formation of voids in the coating film.

The area of the region to be sealed with the curable resin composition per one side of the substrate may be, for example, 90% or more of the projected area of the substrate, and may be, for example, 98% or less. The sealed body may be a single-sided sealed body in which only one side of the substrate is sealed, or a double-sided sealed body in which both sides thereof are sealed.

(Molding Step)

As illustrated in FIG. 2(d), in the molding step, the substrate 10 having the first coating film 21 is set in a compression molding machine 50. The compression molding machine 50 includes an upper mold 51, a lower mold 52, and a flange portion 53 fixed via an elastic member, such as a spring, to the upper mold 51. The upper mold 51 has a flat pressing surface 51a for pressing the first coating film 21. As illustrated in FIG. 2(e), by compressing the first coating film 21 and the substrate 10 together, with the pressing surface 51a abut against the first coating film 21, the first coating film 21 is compressed and converted into a second coating film 22 (FIG. 2(f)). At this time, the flange portion 53 may be pressed down against a non-coating region 10a without the first coating film 21 of the substrate 10. In this case, the curable resin composition 20 for forming the first coating film 21 is allowed to spread until reaching the flange portion 53. At this time, since the pressing surface 51a is flat, the variations in the thickness of the first coating film 21 are reduced. That is, the second coating film 22 having small variations in thickness can be obtained. Although not shown here, the molding step may be performed, with the upper mold 51 and the flange portion 53 both covered with a release film.

The important thing here is to control the degree to which the first coating film 21 is compressed. By restricting the ratio of the projected area S1 of the first coating film 21 onto the substrate 10 to the projected area S2 of the second coating film 22 onto the substrate 10: S1/S2 to 0.9 or more, the flow distance of the curable resin composition 20 constituting the first coating film 21 becomes shorter, and the uneven distribution of the solid component can be reduced. This can suppress the occurrence of flow marks in the second coating film 22. When the S1/S2 ratio is less than 0.9, for example, in the case where the first coating film 21 is as thin as 0.4 mm or less, or where the viscosity of the curable resin composition is high, or where the filler content in the curable resin composition is high, it may be difficult to suppress the occurrence of flow marks.

The molding step may be carried out under atmospheric pressure, or under reduced pressure (e.g., under a pressure of less than 10 hPa). Under reduced pressure, the formation of voids in the second coating film can be suppressed. When performing the molding step under reduced pressure, the reduced pressure can be achieved by, for example, evacuating air from the space in which the compression molding machine 50 is installed, while the compression molding machine 50 is open as illustrated in FIG. 2(d).

The maximum thickness T of the second coating film is, for example, 0.4 mm or less, may be 0.3 mm or less, 0.2 mm or less, and may be 0.15 mm or less or 0.1 mm or less. The lower limit of the maximum thickness of the second coating film is, for example, 0.01 mm or more.

The molding step may be performed while heating the mold. In other words, compression molding may be performed while the curing reaction of the curable resin composition is allowed to proceed. This provides a sealed body (or sealed structure) 100 comprising the substrate 10 sealed with the second coating film 22 in the form of a cured product (or semi-cured product). The heating temperature may be, for example, 80 to 200° C., and may be 100 to 180° C. The heating time may be, for example, 30 s to 30 min, and may be 2 min to 10 min. The sealed body 100 conveyed out of the compression molding machine 50 may be further subjected to post-mold curing (post-curing). The post-mold curing may be performed, for example, at 100 to 180° C., for about 30 min to 2 h.

EXAMPLES

The present invention will be specifically described below with reference to Examples and Comparative Examples. It is to be noted, however, that the present invention is not limited to the following Examples.

Example 1

First, 100 parts by mass of a naphthalene-type epoxy resin serving as a thermosetting resin (base resin), 120 parts by mass of an acid anhydride serving as a curing agent, 25 parts by mass of an imidazole-modified product serving as a curing accelerator, 2060 parts by mass of spherical fused silica (average particle diameter: 21 μm) serving as a filler, and 2 parts by mass of a silane coupling agent were mixed together, to prepare a thermosetting resin composition.

The viscosity of the thermosetting resin composition was measured at 25° C. using an E type (cone-plate type) viscometer (TVE-20H, available from Toki Sangyo Co., Ltd.), with a rotor rotation speed of 10 rpm. The viscosity was 600 Pa·s.

(Printing Step)

Next, the thermosetting resin composition weighed out such that a resultant second coating film had a thickness T=0.1 to 0.4 mm was printed on a silicon wafer substrate having a diameter of 300 mm and a thickness of 775 μm, thereby to form a first coating film having a projected area S1 as shown in Table 1.

(Molding Process)

Next, the first coating film was compressed in a compression molding machine while the pressure is controlled, to form a second coating film having a projected area S2 as shown in Table 1 and having an L/T ratio as shown in Table 1. During the compression molding, the mold was heated to 125° C., so that it took 10 min for the thermosetting resin composition to cure.

The maximum length L of the second coating film was 294 mm. The second coating film was designed to extend over the entire pressing surface of the compression molding machine, and the projected area (678.8 cm²) of the pressing surface onto the substrate coincided with the projected area S2 of the second coating film.

(Appearance Observation)

The second coating film was observed for the presence or absence of flow marks, to determine a maximum length (flow distance) M of a defect-free portion where no flow mark was observed. When no flow mark was observed on the entire surface, the maximum length M=the maximum length L=294 mm. The results are shown in Table 1. Note that the film having a S1/S2 ratio of 0.7 or 0.8 was of Comparative Example.

TABLE 1

| | | | L (mm) | 294 | 294 | 294 | 294 | 294 |
| | | | T (mm) | 0.10 | 0.15 | 0.20 | 0.30 | 0.40 |
| | | | L/T | 2940 | 1960 | 1470 | 980 | 735 |
| S1 (cm²) | S2 (cm²) | S1/S2 | — | — | — | — | — |
| 670 | 679 | 1.0 | | 294 | 294 | 294 | 294 | 294 |
| 611 | 679 | 0.9 | | 294 | 294 | 294 | 294 | 294 |
| 543 | 679 | 0.8 | | 270 | 275 | 279 | 284 | 290 |
| 475 | 679 | 0.7 | | 254 | 260 | 260 | 264 | 268 |

Table 1 shows that it is important to set the S1/S2 ratio to 0.9 or more in order to obtain a second coating film with good appearance without flow marks. Moreover, the smaller the thickness T of the second coating film is, the smaller the maximum length (flow distance) M of the portion free of appearance defects is when the S1/S2 ratio is less than 0.9.

Example 2

Next, a first coating film was formed by printing in the same manner as in Example 1, except that the S1/S2 ratio was fixed at 0.95. The first coating film was subjected to compression molding, to form a second coating film having a L/T ratio as shown in Table 2. The thickness T of the second coating film was accurately measured at 10 points, to determine a standard deviation σ of the thickness T. The results are shown in Table 2.

TABLE 2

| T (mm) | L/T | Evaluation | Ex. 2 | Com. Ex. 1 | Com. Ex. 2 |
| --- | --- | --- | --- | --- | --- |
| 0.20 | 1470 | M (mm) | 294 | 215 | 294 |
| | | σ | 6.6 | 4.9 | 34.5 |
| 0.15 | 1960 | M (mm) | 294 | 192 | 294 |
| | | σ | 5.3 | 5.7 | 25.5 |
| 0.10 | 2940 | M (mm) | 294 | 156 | 294 |
| | | σ | 3.5 | 4.1 | 19.5 |

Comparative Example 1

A second coating film was formed and evaluated in the same manner as in Example 2, except that the thermosetting resin composition was applied to the substrate by potting, instead of printing, and then compression molding was performed. The results are shown in Table 2.

Comparative Example 2

A second coating film (cured product of the first coating film) was formed and evaluated in the same manner as in Example 2, except that the first coating film formed by printing was directly heated to be cured, without being subjected to compression molding. The results are shown in Table 2.

In Table 2, a comparison between Example 2 and Comparative Example 1 shows that the maximum length (flow distance) M of the portion free of appearance defects in Comparative Example 1 in which printing was not performed was significantly decreased than that in Example 2. A comparison between Example 2 and Comparative Example 2 shows that the standard deviation δ of the thickness T in Comparative Example 2 in which compression molding was not performed was noticeably increased than that in Example 2.

A method of producing a sealed structure according to the present invention is usefully applicable to a method of producing a mounting structure in which a substrate (esp., a package, such as PLP or WLP) is sealed using a curable resin composition in a liquid form. The method enables to form on the substrate a coating film in the form of a cured product of the curable resin composition such that the coating film has a uniform thickness and good appearance without flow marks.

REFERENCE NUMERALS

10: substrate, 10a: non-coating region, 11: semiconductor element, 20: curable resin composition, 21: first coating film, 22: second coating film, 30: stencil, 40: squeegee, 50: compression molding machine, 51: upper mold, 51a: pressing surface, 52: lower mold, 53: flange portion, 100: sealed body

What is claimed is:

1. A method of producing a sealed structure, the method comprising:
   a first step of preparing a substrate and a curable resin composition in a liquid form; and
   a second step of sealing the substrate with the curable resin composition, to form a sealed body including the substrate and a cured product of the curable resin composition,
   the second step including:
   a printing step of printing the curable resin composition onto the substrate, to cover the substrate with a first coating film of the curable resin composition; and
   a molding step of compression-molding the first coating film and the substrate together using a mold, with a pressing surface of the mold abut against the first coating film, to convert the first coating film into a second coating film, wherein
   a ratio of a projected area S1 of the first coating film onto the substrate to a projected area S2 of the second coating film onto the substrate: S1/S2 is 0.9 or more.

2. The method of producing a sealed structure according to claim 1, wherein a ratio of a maximum length L (mm) of the second coating film to a maximum thickness T (mm) of the second coating film: L/T is more than 653.

3. The method of producing a sealed structure according to claim 2, wherein the ratio L/T is 720 or more.

4. The method of producing a sealed structure according to claim 1, wherein a maximum thickness T of the second coating film is 0.4 mm or less.

5. The method of producing a sealed structure according to claim 1, wherein the printing step is performed under a reduced pressure of 300 hPa or less.

* * * * *